(12) United States Patent  (10) Patent No.: US 7,852,158 B2
Kobayashi et al.  (45) Date of Patent: Dec. 14, 2010

(54) OPERATIONAL AMPLIFIER (75) Inventors: Satoshi Kobayashi, Osaka (JP); Junji Nakatsuka, Osaka (JP)

(73) Assignee: Panasonic Corporation, Osaka (JP)

( * ) Notice: Subject to any disclaimer, the term of this patent is extended or adjusted under 35 U.S.C. 154(b) by 171 days.

(21) Appl. No.: 12/296,367

(22) PCT Filed: May 21, 2007

(86) PCT No.: PCT/JP2007/060353

§ 371 (c)(1),
(2), (4) Date: Oct. 7, 2008

(87) PCT Pub. No.: WO2008/065762

PCT Pub. Date: Jun. 5, 2008

(65) Prior Publication Data

US 2009/0284315 A1  Nov. 19, 2009

(30) Foreign Application Priority Data

Nov. 30, 2006  (JP) .............................. 2006-323901

(51) Int. Cl.
H03F 3/45  (2006.01)
(52) U.S. Cl. .................. 330/260; 330/293; 330/294
(58) Field of Classification Search .................. 330/260, 330/293, 294
See application file for complete search history.

(56) References Cited

U.S. PATENT DOCUMENTS 4,733,149 A * 3/1988 Culberson ................... 318/561
4,811,401 A * 3/1989 Brown et al. .................. 381/61
5,120,986 A * 6/1992 Shekhawat ................... 327/129
5,745,010 A * 4/1998 Miyamoto et al. ........... 330/294
6,538,491 B1 * 3/2003 Spanoche ................... 327/337
7,403,749 B2 * 7/2008 Kuijstermans et al. ... 455/114.2

FOREIGN PATENT DOCUMENTS

JP  61-123208  6/1986
JP  1-221005  9/1989
JP  05-145348  6/1993

(Continued)

Primary Examiner—Patricia Nguyen
(74) Attorney, Agent, or Firm—McDermont Will & Emery LLP (57) ABSTRACT An operational amplifier includes, between an input and an output of an operational amplifier (an operational amplification stage) 10, a feedback capacitor 34 connected in negative feedback, a phase control circuit 100 having a resistor element (a resistor unit) 30 connected in series to the feedback capacitor 34. Load capacitors (load units) 32 are connected on the output side of the operational amplifier 10 and driven by an output signal from the operational amplifier 10. In a case that the capacitance values of the load capacitor 32 and 33 are increased and the phase margin of the operational amplifier becomes excessive in comparison with the optimum value, a resistance value $R_O$ of the resistor element 30 is increased to control the phase margin of the operational amplifier so as to fall within the optimum range, and thus accelerated settling properties are realized. This invention thus provides a phase control circuit applicable even to a single-stage operational amplifier, and by enhancing the properties of the operational amplifier itself and enabling the phase margin to be controlled, realizes accelerated settling properties even in a case that a transient response is deteriorated.

16 Claims, 9 Drawing Sheets

FOREIGN PATENT DOCUMENTS

| | | |
|---|---|---|
| JP | 2555046 | 11/1997 |
| JP | 10-187100 | 7/1998 |
| JP | 2000-333040 | 11/2000 |
| JP | 2001-119297 | 4/2001 |
| JP | 2002-190721 | 7/2002 |
| JP | 2003-008361 | 1/2003 |
| JP | 2004-120564 | 4/2004 |
| JP | 2006-058360 | 3/2006 |

* cited by examiner

OPERATIONAL AMPLIFIER

RELATED APPLICATIONS

This application is the U.S. National Phase under 35 U.S.C. §371 of International Application No. PCT/JP2007/060353, filed on May 21, 2007, which in turn claims the benefit of Japanese Application No. 2006-323901, filed on Nov. 30, 2006, the disclosures of which Applications are incorporated by reference herein.

TECHNICAL FIELD

The present invention relates to an operational amplifier for driving a load unit.

BACKGROUND ART

Conventional negative feedback operational amplifier for driving a load unit, such as switched capacitor amplifiers, had a disadvantage of varying the capacitance value of the load unit connected on the output side of the operational amplifier due to, for example, temperature change or replacement of a load element in the load unit and change in a feedback gain, and thus making the system unstable. They were designed to have large circuit margin in consideration of a worst case condition for securing the system stability, resulting in creating other problems, such as sacrificing circuit acceleration and increased power consumption.

As an example of the remedies, a technique is known, as described in the Patent Document 1, that controls phase margin of an operational amplifier by newly providing a phase control circuit having a capacitor and a resistor for phase compensation between a first operational amplification stage and a second operational amplification stage in the operational amplifier to enable to modify a capacitance value of the capacitor for phase compensation and a resistance value of the resistor for phase compensation from outside. This technique secures optimized phase margin by controlling the phase margin to prevent ringing and oscillation of output from an operational amplifier, and thus realizes acceleration by enhancing the properties of the operational amplifier itself.

As another example, a conventional technique is known, as described in the Patent Document 2, that realizes acceleration by newly providing a resistor element, equivalent to a load element in a load unit driven by an operational amplifier, in the load unit and controlling the resistance value of the resistor element in a case that the replacement of the load element causes the capacitance value of the load unit to vary. This technique controls the resistance value of the resistor element to make a time constant of a feedback stage subject to negative feedback to the operational amplifier equivalent to a time constant of the load unit driven by the operational amplifier for optimizing response speed of the operational amplifier and enabling the operational amplifier to develop the properties, and thus realizes acceleration.

[Patent Document 1] JP2004-120564 A
[Patent Document 2] JP2002-190721 A

DISCLOSURE OF INVENTION

Problems to be Solved by the Invention

In general, a transfer function $A_o$ of an operational amplifier having two poles is expressed as Formula 1 below.

$$A_o(s) \frac{A}{(1+s/\omega_{p1})(1+s/\omega_{p2})} \quad \text{Formula 1}$$

In Formula 1, A represents a direct current gain of an operational amplifier, and phase margin of the operational amplifier is defined by positional relationship between a main pole $\omega_{p1}$, and a second pole $\omega_{p2}$. To be specific, a shorter distance between the main pole $\omega_{p1}$, and the second pole $\omega_{p2}$ decreases phase margin, and a longer distance between the main pole $\omega_{p1}$, and the second pole $\omega_{p2}$ increases margin.

Figure 17:
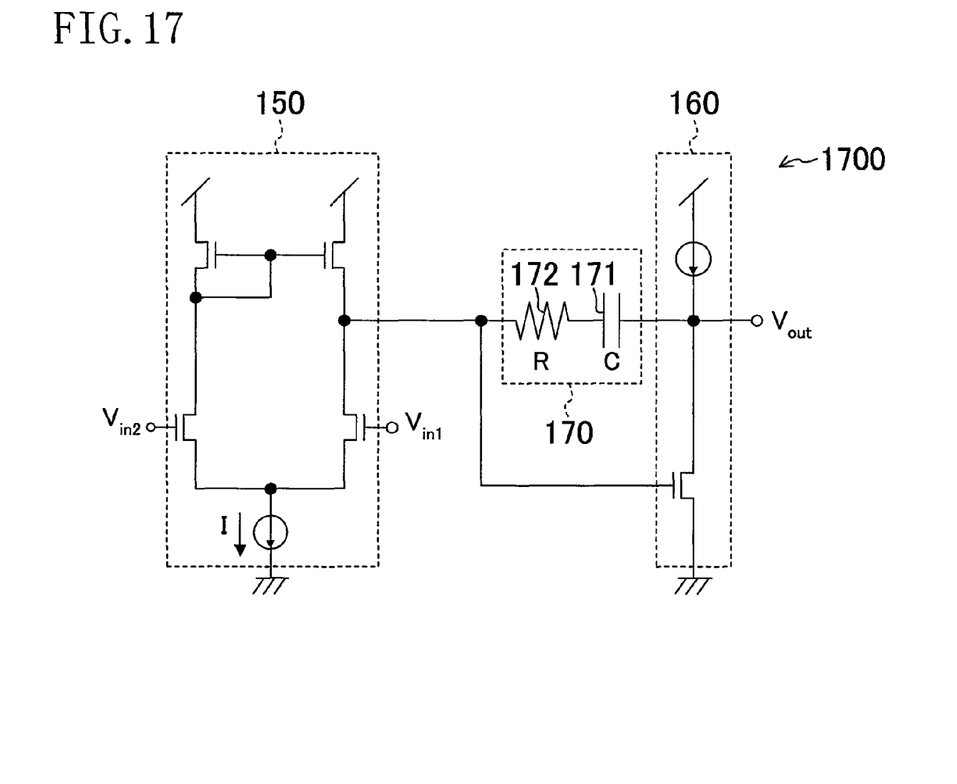
FIG. 17 is a circuit diagram illustrating the overall structure of a conventional two-stage operational amplifier having a phase control circuit.

FIG. 17 is a circuit diagram illustrating the overall structure of a conventional two-stage operational amplifier applying the technique described in Patent Document 1.

In this diagram, a two-stage operational amplifier 1700 includes a first operational amplification stage 150, a second operational amplification stage 160, and a phase control circuit 170. The phase control circuit 170 is disposed between the first operational amplification stage 150 and the second operational amplification stage 160 and includes, inside, a phase compensation capacitor 171 and a phase compensation resistor 172.

An operational amplifier having a phase control circuit, typically as FIG. 17, has a transfer function $A_o$ expressed as Formula 2 below, and the transfer function has a zero point $\omega_z$.

$$A_o(s) \frac{A(1+s/\omega_z)}{(1+s/\omega_{p1})(1+s/\omega_{p2})} \quad \text{Formula 2}$$

In Formula 2, it is known that phase margin of an operational amplifier is determined from positional relationship between the poles $\omega_{p1}$ and $\omega_{p2}$ and the zero point $\omega_z$.

It is known that a transient response by an operational amplifier, typically as a step response, is generally determined by the phase margin of the operational amplifier and the optimum range of the phase margin is from 45° to 60°. When the operational amplifier has the phase margin within the range or less, the transient response is subject to ringing and overshoot and requires a longer settling time. When the phase margin is within the range or more, the transient response is subject to overdamping and it causes a longer settling time although the transient response is not overshot. It is thus desired to design an operational amplifier, considering factors such as influence of production variation and a risk of oscillation, by securing 60° or more for the phase margin.

In order to accommodate the variation in production processes, the technique described in Patent Document 1 enables to modify the capacitance value of the phase compensation capacitor and the resistance value of the phase compensation resistor from outside to optimize the zero point $\omega_z$ to a value least likely to oscillate after producing the operational amplifier, and thus controls the phase margin.

Figure 18:
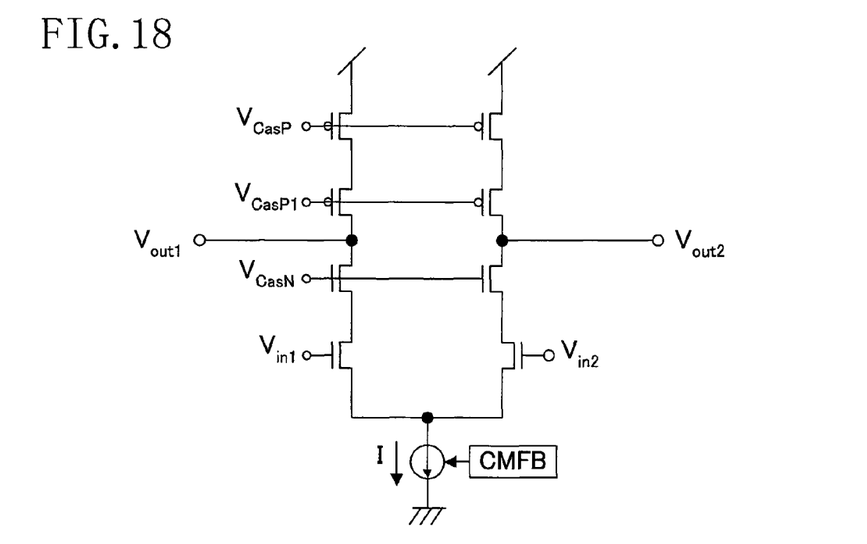
FIG. 18 is a circuit diagram illustrating a circuit structure of a conventional single-stage operational amplifier of a fully differential telescopic cascode type.

Suppose a conventional single-stage operational amplifier, such as a telescopic cascode type in FIG. 18, were an ideal single-stage operational amplifier, it would have a transfer function including only a main pole $\omega_{p1}$ and having the phase not more than 90° and the phase margin always not less than 90°. Even in a case that an actual operational amplifier includes a second pole $\omega_{p2}$, the second pole $\omega_{p2}$ is a parasitic pole generated by a parasitic capacitor and may be generated at a point extremely distant from the point of origin. In a single-stage operational amplifier, a larger capacitance value of a load unit connected to the single-stage operational amplifier makes the main pole $\omega_{p1}$ to move closer to the point of origin, and thus the positions of the main pole $\omega_{p1}$ and the second pole $\omega_{p2}$ become more distant to ensure stability of the system. Conventionally, ringing and overshoot are not generated in transient responses, and single-stage operational amplifiers are not provided with a phase control circuit.

Phase margin of a single-stage operational amplifier, however, varies according to a capacitance value of a load unit driven by the single-stage operational amplifier as described above. In a case of an excessively large capacitance value of the load unit, phase margin is thus excessive compared to the optimum value and the speed of a transient response is deteriorated to make the settling time longer, which is a problem.

The technique described in Patent Document 1 may then be considered to be employed to control phase margin of a single-stage operational amplifier. The technique described in Patent Document 1 is, however, subject to application for a multi stage operational amplifier, in which the phase control circuit 170 is provided between the first operational amplification stage 150 and the second operational amplification stage 160, and it is not possible to apply such circuit structure to a single-stage operational amplifier.

In contrast, the technique described in Patent Document 2 is to realize acceleration by optimizing response speed of an operational amplifier, but it does not establish the phase margin at the optimum value by enhancing the properties of the operational amplifier itself. To ensure the stability by accommodating the variation in the capacitance value of a load unit, a resistor element functioning similarly to a phase compensation resistor is required to be included in the load unit and a general-purpose load unit is not allowed to be used for the load unit driven by the operational amplifier. The application of an operational amplifier having such load unit is thus extremely limited.

The present invention was made by addressing these issues, and an object of the invention is to provide a phase control circuit applicable even to a single-stage operational amplifier and, by enhancing the properties of the operational amplifier itself and enabling control of the phase margin, further to realize accelerated settling properties even when a transient response is deteriorated.

Means for Solving the Problems

To accomplish the object, according to the present invention, an operational amplifier having an operational amplification stage for amplifying a signal newly includes a phase control circuit having a feedback capacitor, connected in negative feedback between an input and an output of the operational amplification stage, and a resistor unit, connected in series to the feedback capacitor, and is structured to enable to control the phase margin of the operational amplifier by controlling the resistance value of the resistor unit.

Specifically, an operational amplifier of the present invention includes: an operational amplification stage for amplifying a signal; a sampling capacitor connected to an input side of the operational amplification stage; a load unit driven by an output signal of the operational amplification stage; and a phase control circuit having a feedback capacitor connected in negative feedback between an output side of the operational amplification stage and the input side of the operational amplification stage. The phase control circuit includes a resistor unit connected in series to the feedback capacitor.

In the operational amplifier of the present invention, the resistor unit is disposed between the output side of the operational amplification stage and the feedback capacitor.

In the operational amplifier of the present invention, the resistor unit is disposed between the input side of the operational amplification stage and the feedback capacitor.

In the operational amplifier of the present invention, the load unit is connected between the resistor unit and the feedback capacitor.

In the operational amplifier of the present invention, the resistor unit is disposed at least one of: a position between the output side of the operational amplification stage and the feedback capacitor; and a position between the feedback capacitor and the input side of the operational amplification stage.

In the operational amplifier of the present invention, the input side of the operational amplification stage includes a positive phase input terminal and a negative phase input terminal, the output side of the operational amplification stage includes a positive phase output terminal and a negative phase output terminal, and the phase control circuit includes a first phase control circuit and a second phase control circuit, the first phase control circuit including a feedback capacitor connected in negative feedback between the negative phase output terminal and the positive phase input terminal and a resistor unit connected in series to the feedback capacitor, and the second phase control circuit including a feedback capacitor connected in negative feedback between the positive phase output terminal and the negative phase input terminal and a resistor unit connected in series to the feedback capacitor.

In the operational amplifier of the present invention, the input side of the operational amplification stage includes a positive phase input terminal and a negative phase input terminal, the output side of the operational amplification stage includes an output terminal, and the phase control circuit is disposed between the output terminal and the negative phase input terminal.

In the operational amplifier of the present invention, the resistor unit includes a transistor, and a resistance value of the resistor unit is an ON resistance of the transistor.

In the operational amplifier of the present invention, the resistor unit is a variable resistor unit having a variable resistance value.

In the operational amplifier of the present invention, the variable resistor unit includes a plurality of resistor elements having different resistance values, and a switch, and the resistance value of the variable resistor unit is varied by switching the switch to modify the combination of the plurality of resistor elements.

In the operational amplifier of the present invention, the variable resistor unit includes a plurality of switches having different ON resistances, and
the resistance value of the variable resistor unit is varied by switching the plurality of switches to modify the combination of the switches.

In the operational amplifier of the present invention, the switch is a MOS switch, and the resistance value of the variable resistor unit is varied by varying an ON resistance of the MOS switch.

In the operational amplifier of the present invention, the ON resistance of the MOS switch is varied according to a gate voltage value of a MOS transistor, and the resistance value of the variable resistor unit varies according to a variation in the gate voltage value.

In the operational amplifier of the present invention, the ON resistance of the MOS switch varies according to a backgate voltage value of a MOS transistor, and the resistance value of the variable resistor unit varies according to a variation in the backgate voltage value.

In the operational amplifier of the present invention, the resistor unit is formed of a bipolar transistor.

Accordingly, since the present invention is provided with a phase control circuit having a feedback capacitor and a resistor unit connected in series between an input and an output of an operational amplification stage, phase control becomes possible even for a single-stage operational amplifier having only one operational amplification stage. In addition, when the capacitance value of the load unit driven by the operational amplifier is increased and the phase margin is excessively increased, the invention increases the resistance value of the resistor unit in the phase control circuit to enable phase margin control by decreasing it so as to fall within the optimum range.

EFFECTS OF THE INVENTION

As described above, according to the present invention, a phase control circuit is provided which has a feedback capacitor and a resistor unit connected in series between an input and an output of an operational amplification stage, and the phase control circuit controls the phase margin of the operational amplifier so as to fall within the optimum range, and thus accelerated settling properties are realized even when a transient response is deteriorated.

DESCRIPTION OF REFERENCE NUMERALS

10 Operational Amplifier (Operational Amplification Stage)
11 Negative Phase Output Terminal
12 Positive Phase Output Terminal
21 Positive Phase Input Terminal
22 Negative Phase Input Terminal
30, 31 Resistor Element (Resistor Unit)
32, 33 Load Capacitor (Load Unit)
34, 35 Feedback Capacitor
36, 37 Sampling Capacitor
100, 110 Phase Control Circuit
$C_f$ Capacitance Value of Feedback Capacitor
$C_s$ Capacitance Value of Sampling Capacitor
$C_L$ Capacitance Value of Load Capacitor
$R_O$ Resistance Value of Resistor Element
$g_m$ Transconductance Value of Operational Amplifier
$r_O$ Resistance Value of Resistor Element in Operational Amplifier
400, 401, 403, 404, 405, 406 Variable Resistor Unit
402 Gate Voltage Control Circuit
407 Substrate Control Circuit
410 Resistor Selection Signal

BEST MODE FOR CARRYING OUT THE INVENTION

Hereinafter, operational amplifiers according to embodiments of the present invention are illustrated with reference to the drawings.

First Embodiment

Figure 1:
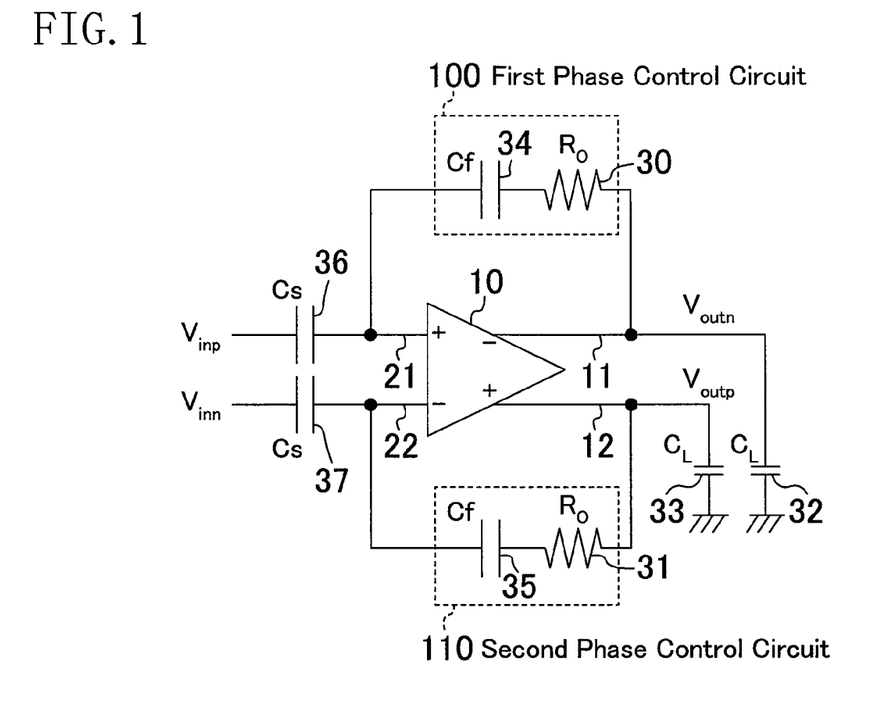
FIG. 1 is a circuit diagram illustrating the overall structure of an operational amplifier according to the first embodiment of the present invention.

FIG. 1 is a circuit diagram illustrating the overall structure of an operational amplifier of the first embodiment of the present invention.

In FIG. 1, the element 10 is a fully differential operational amplifier (an operational amplification stage). The operational amplifier 10 includes a positive phase input terminal 21 and a negative phase input terminal 22 on the input side and includes a positive phase output terminal 12 and a negative phase output terminal 11 on the output side. Sampling capacitors 36 and 37 are connected to the input side of the operational amplifier 10. Load capacitors (load units) 32 and 33 are connected on the output side of the operational amplifier 10 and driven by an output signal from the operational amplifier 10.

Between the negative phase output terminal 11 and the positive phase input terminal 21 of the operational amplifier 10, a first phase control circuit 100 is provided which includes a feedback capacitor 34 connected in negative feedback and a resistor element (a resistor unit) 30 connected in series to the feedback capacitor 34. Between the positive phase output terminal 12 and the negative phase input terminal 22 of the operational amplifier 10, a second phase control circuit 110 is provided which includes a feedback capacitor 35 connected in negative feedback and a resistor element (a resistor unit) 31 connected in series to the feedback capacitor 35.

In order to discuss the stability of the operational amplifier, we now define an open loop transfer function. The operational amplifier 10 in this discussion is supposed to be formed of a telescopic cascode type single-stage operational amplifier, which is a general fully differential operational amplifier shown in FIG. 18.

Figure 2:
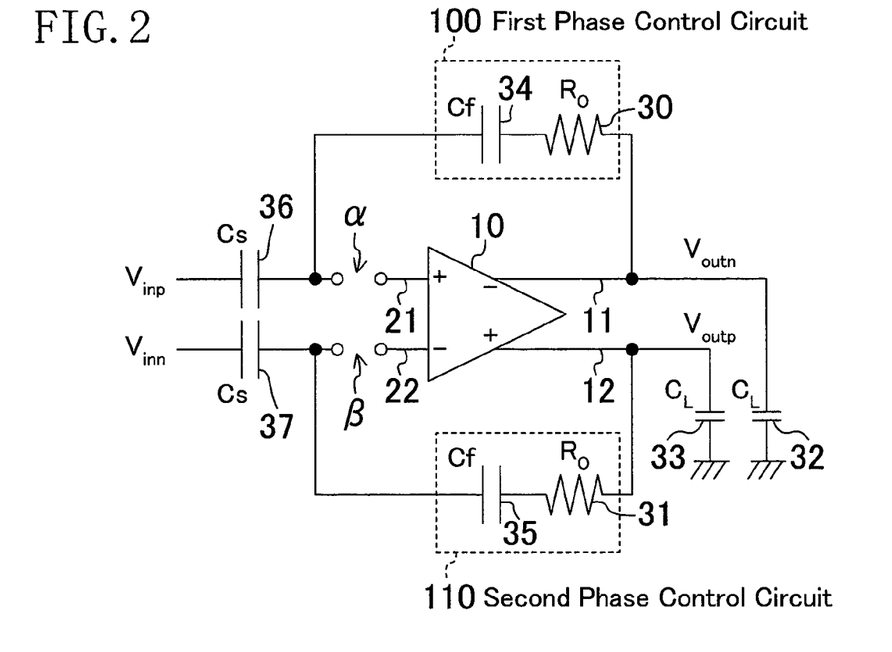
FIG. 2 is a diagram illustrating feedback loops cut off in the operational amplifier.
Figure 3:
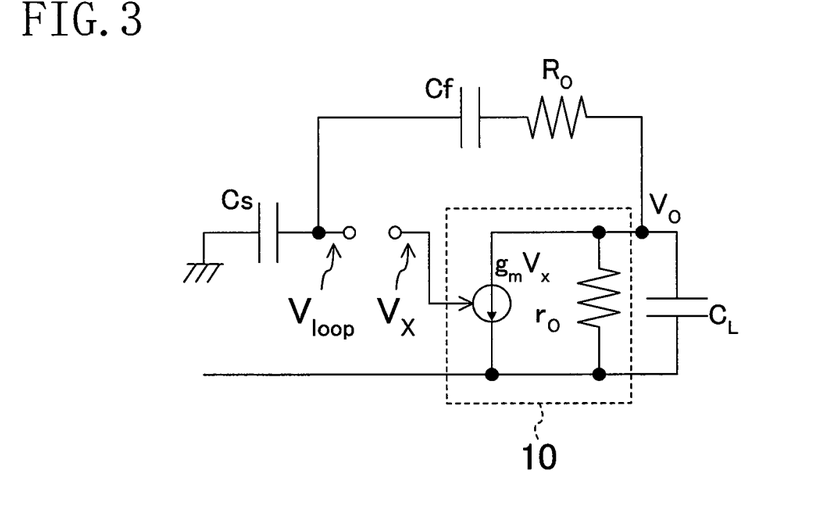
FIG. 3 is a circuit diagram illustrating the overall structure of a small signal equivalent circuit in the operational amplifier.

Cutting off the two feedback loops formed of the first phase control circuit 100 and the second phase control circuit 110 of FIG. 1 at cutoff points α and β, shown in FIG. 2, on the input side of the operational amplifier 10 enables to represent the operational amplifier of FIG. 1 by a small signal equivalent circuit of FIG. 3.

In the small signal equivalent circuit of FIG. 3, the open loop transfer function $A_1 = V_{loop}/V_x$ is expressed as Formula 3 below. In the formulas below, $C_s$ represents the capacitance value of the sampling capacitor, $C_L$ represents the capacitance value of the load capacitor, $C_f$ represents the capacitance value of the feedback capacitor, and $R_O$ represents the resistance value of a resistor element. $r_O$ represents the resistance value of a resistor element in the operational amplifier 10, and $g_m$ represents the transconductance value of the operational amplifier 10.

$$A_1(s) = \frac{C_f}{C_s + C_f} \cdot \frac{-g_m r_o}{(1 + s(CR_o + Cr_o + C_L r_o) + s^2 C_L CR_o r_o)}, \quad \text{Formula 3}$$

$$C = \frac{C_s C_f}{C_s + C_f}$$

In Formula 3 above, $r_O \gg R_O$ in general, and it is possible to approximate Formula 3 to Formula 4 below.

$$A_1(s) = \frac{C_f}{C_s + C_f} \cdot \frac{-g_m r_o}{(1 + s(Cr_o + C_L r_o) + s^2 C_L CR_o r_o)} \quad \text{Formula 4}$$

It is possible to express a generalized open loop transfer function of an operational amplifier having two poles $\omega_{p1}$ and $\omega_{p2}$ by a quadratic as Formula 5 below.

$$A_1(s) = \frac{C_f}{C_s + C_f} \cdot \frac{-g_m r_o}{(1 + s/\omega_{p1})(1 + s/\omega_{p2})} \quad \text{Formula 5}$$

In Formula 5 above, the relationship between the main pole $\omega_{p1}$ and the second pole $\omega_{p2}$ of a single-stage operational amplifier is $\omega_{p2} \gg \omega_{p1}$, and it is possible to approximate Formula 5 to Formula 6 below.

$$A_1(s) = \frac{C_f}{C_s + C_f} \cdot \frac{-g_m r_o}{1 + s/\omega_{p1} + s^2/\omega_{p1}\omega_{p2}} \quad \text{Formula 6}$$

By comparing Formula 4 calculated based on the small signal equivalent circuit of FIG. 3 with generalized Formula 6, the values of the main pole $\omega_{p1}$ and the second pole $\omega_{p2}$ of the small signal equivalent circuit of FIG. 3 are obtained as shown in Formula 7 below.

$$\omega_{p1} = \frac{1}{r_o(C_L + C)}, \quad \omega_{p2} = \frac{1}{R_o\left(\frac{C_L C}{C_L + C}\right)} \quad \text{Formula 7}$$

In Formula 7 above, $\omega_{p2} \gg \omega_{p1}$ holds when $r_O \gg R_O$, and the approximation of Formula 4 is thus validated.

By substituting the values $\omega_{p1}$ and $\omega_{p2}$ of Formula 7 into Formula 5, it is possible to express the open loop transfer function of the operational amplifier of this embodiment as Formula 8 below.

$$A_1(s) = \frac{C_f}{C_s + C_f} \cdot \frac{-g_m r_o}{(1 + sr_o(C_L + C))\left(1 + sR_o\left(\frac{C_L C}{C_L + C}\right)\right)} \quad \text{Formula 8}$$

Suppose an open loop transfer function A for a case that a phase control circuit not be provided, $R_O = 0$ in Formula 8 above and A would be expressed as Formula 9 below.

$$A_1(s) = \frac{C_f}{C_s + C_f} \cdot \frac{-g_m r_o}{(1 + sr_o(C_L + C))} \quad \text{Formula 9}$$

Comparing Formulas 8 and 9 above, it is found that, by providing the resistor element in the phase control circuit, the open loop transfer function of the operational amplifier has the second pole $\omega_{p2}$ due to the resistance value $R_O$ of the resistor element and the phase margin of the operational amplifier is decreased.

As described above, the operational amplifier of this embodiment shown in FIG. 1 includes the first and the second phase control circuits 100 and 110 inside the operational amplifier having one operational amplification stage formed of the operational amplifier 10. When the capacitance value $C_L$ in the load capacitors 32 and 33 increase and the phase margin becomes excessive in comparison with the optimum value, the operational amplifier thus controls the position of the second pole $\omega_{p2}$ by increasing the resistance values $R_O$ of the resistor elements 30 and 31 of the phase control circuits 100 and 110 to control the phase margin of the operational amplifier so as to fall within the optimum range.

Figure 4:
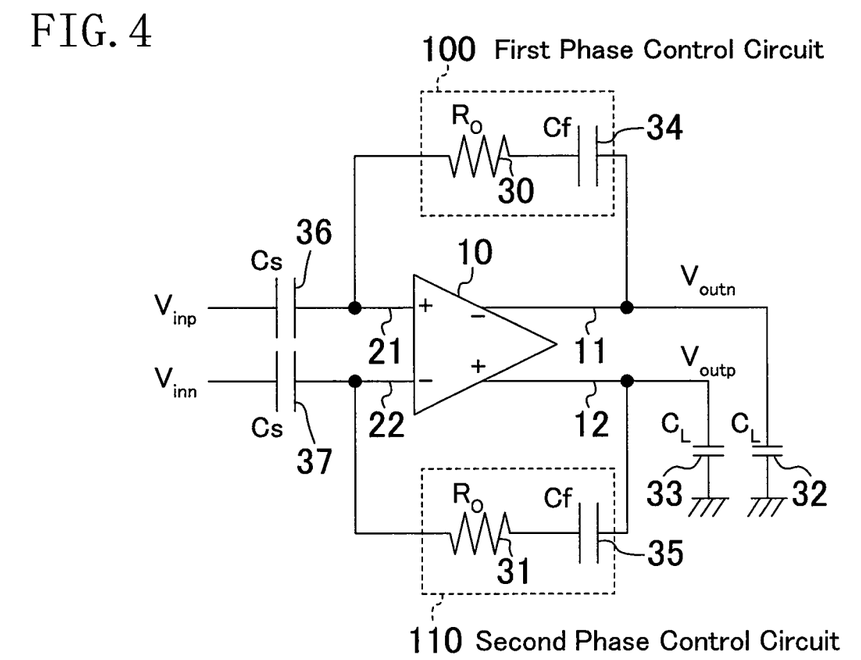
FIG. 4 is an example of a modified operational amplifier according to the first embodiment of the present invention.
Figure 5:
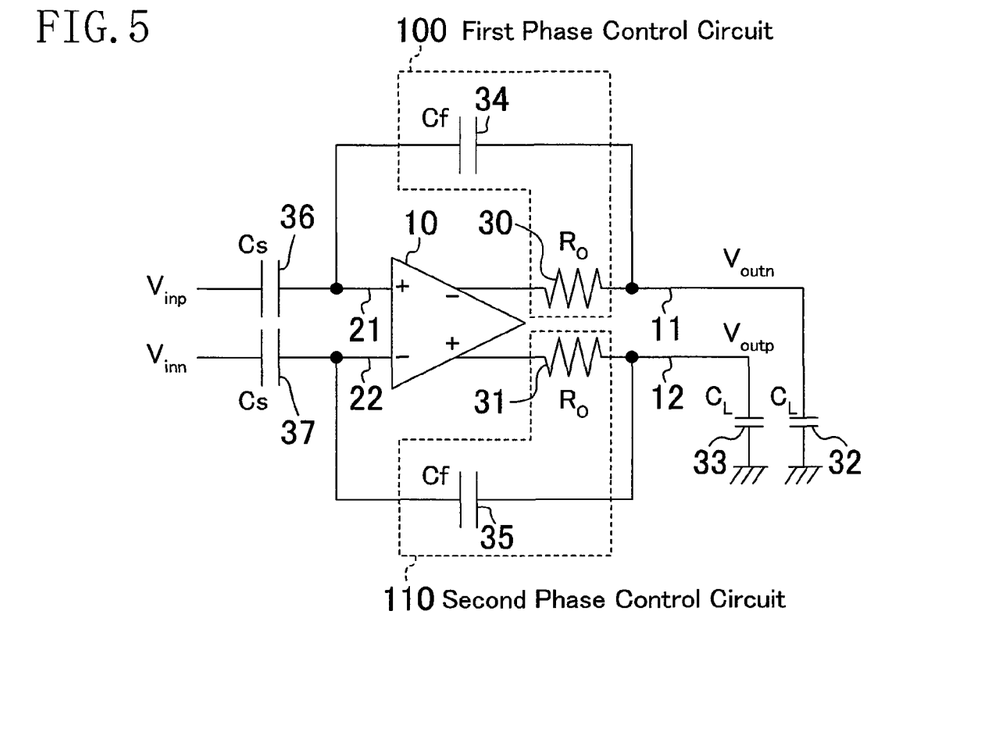
FIG. 5 is another example of a modified operational amplifier according to the first embodiment.

It should be noted that, although the resistor elements 30 and 31 are disposed between the output side of the operational amplifier 10 and the feedback capacitors 34 and 35 in this embodiment, the resistor elements 30 and 31 may be disposed between the input side of the operational amplifier 10 and the feedback capacitors 34 and 35 as shown in FIG. 4. Even in this case, it is possible to control the phase margin of the operational amplifier so as to fall within the optimum range. Alternatively, as shown in FIG. 5, the load capacitors 32 and 33 may be provided between the resistor elements 30 and 31 and the feedback capacitors 34 and 35.

Figure 6:
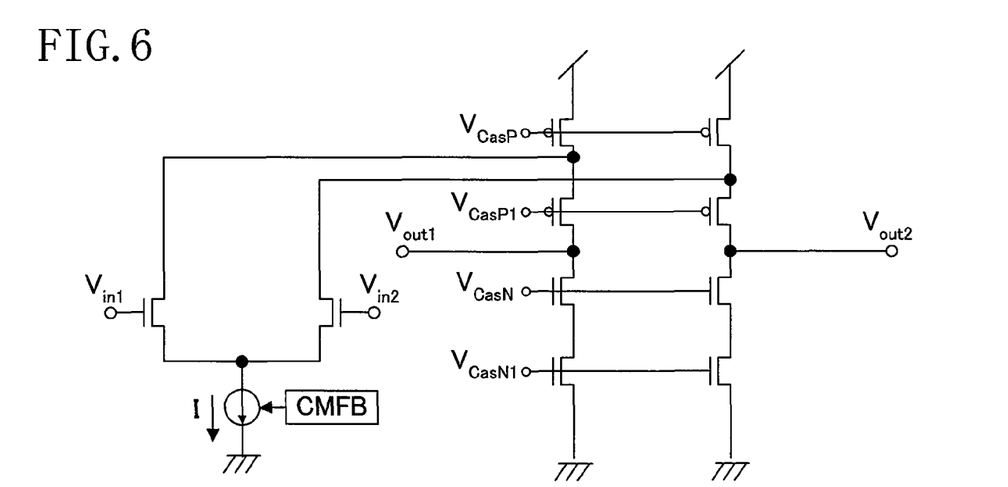
FIG. 6 is a circuit diagram illustrating a circuit structure of a conventional single-stage operational amplifier of a fully differential folded type.

Although in the above example the operational amplification stage 10 is an operational amplifier of a fully differential telescopic cascode type shown in FIG. 18, the present invention is also applicable to other types of operational amplifier, such as a single-stage operational amplifier of a folded type shown in FIG. 6.

Figure 7:
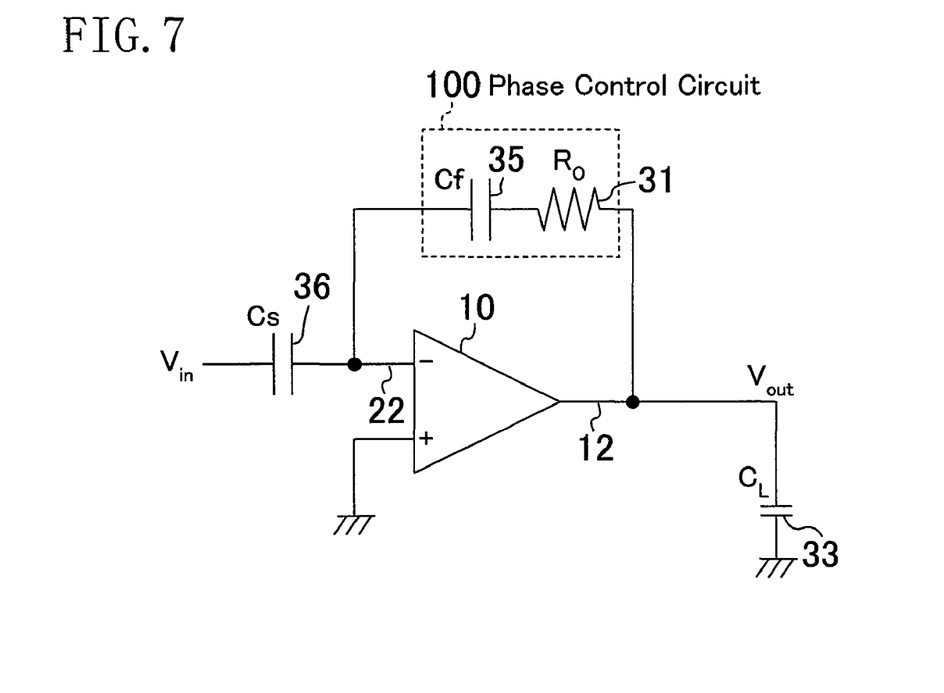
FIG. 7 is a circuit diagram illustrating the overall structure of an operational amplifier having a single ended operational amplification stage of the present invention.
Figure 8:
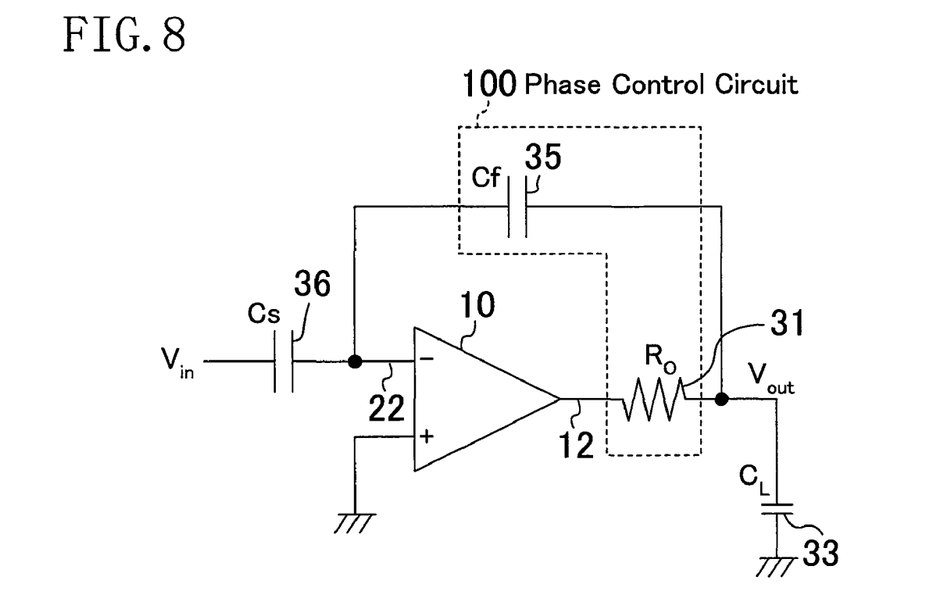
FIG. 8 is an example of a modified operational amplifier having a single ended operational amplification stage of the present invention.
Figure 9:
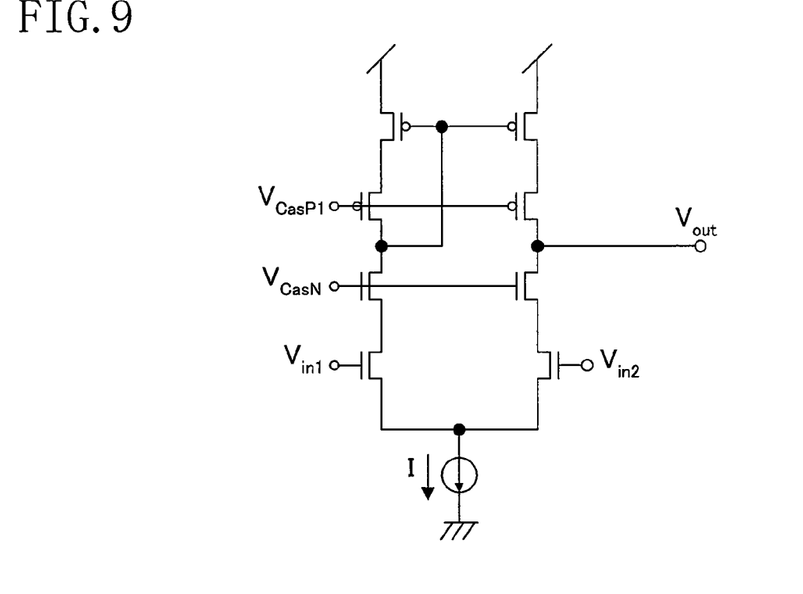
FIG. 9 is a circuit diagram illustrating a circuit structure of a conventional single-stage operational amplifier with a single ended output of a telescopic cascode type.
Figure 10:
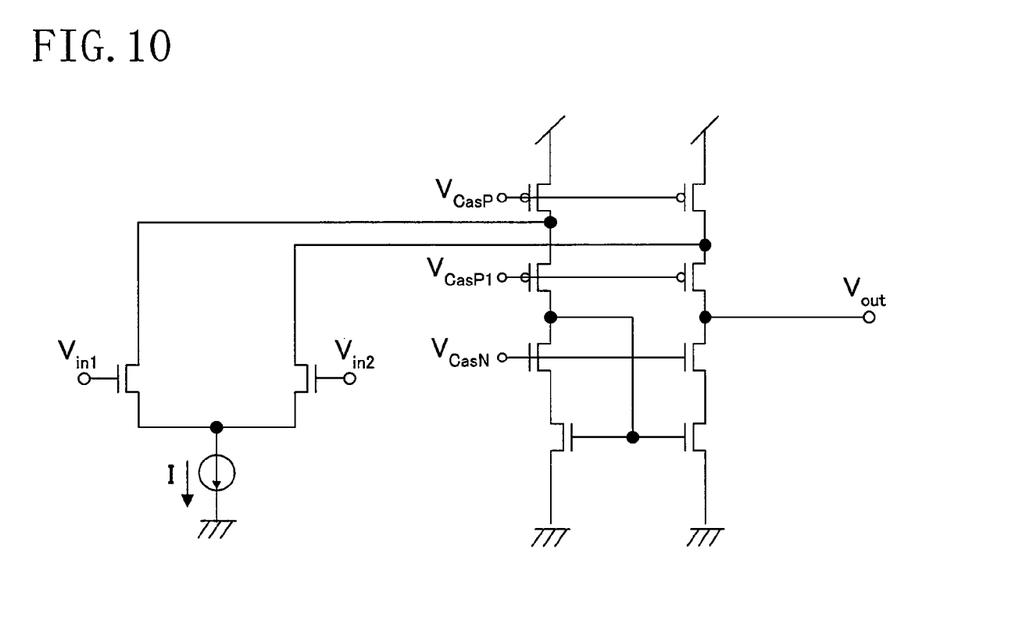
FIG. 10 is a circuit diagram illustrating a circuit structure of a conventional single-stage operational amplifier with a single ended output of a folded type.

Alternatively, as shown in FIGS. 7 and 8, the operational amplification stage 10 may be a single ended output type. Even in a case that a phase control circuit 100 is provided which is connected in negative feedback between the output terminal 12 on the output side of the operational amplification stage 10 and the negative phase input terminal 22 on the input side, it is possible to control the phase margin of the operational amplifier so as to fall within the optimum range. Examples of such single ended output type include, as shown in FIGS. 9 and 10, a telescopic cascode type operational amplifier and a folded type operational amplifier.

The operational amplification stage 10 may include two or more operational amplification stages. Even in this case, it is possible to control the phase margin of the operational amplifier so as to fall within the optimum range.

In the operational amplifier of this embodiment, the resistor unit in the phase control circuit may be formed of a transistor to determine the resistance value of the resistor unit according to the ON resistance of the transistor, and the transistor may be a bipolar transistor.

The open loop transfer function above is a typical one according to this embodiment, and the transfer function may employ various forms depending on the operational amplification stage applied to the present invention. Such modifications apparent to those skilled in the art are all within the scope of the present invention.

Second Embodiment

Figure 11:
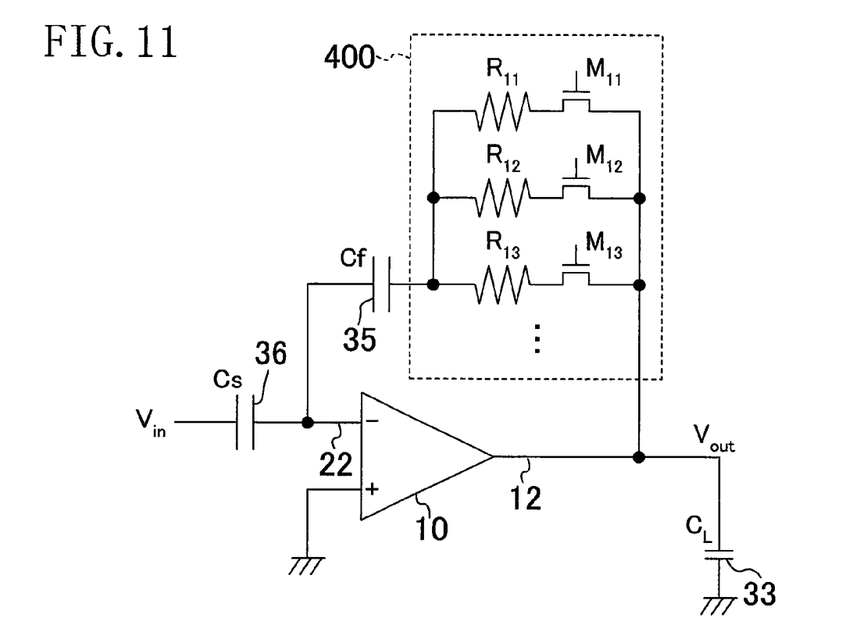
FIG. 11 is a circuit diagram illustrating the overall structure of an operational amplifier according to the second embodiment of the present invention.

FIG. 11 is a circuit diagram illustrating the overall structure of an operational amplifier according to the second embodiment of the present invention.

The difference from the operational amplifier of FIG. 7 is only that the resistor unit connected in series to the feedback capacitor 35 connected in negative feedback between the input and the output of the operational amplifier 10 is a variable resistor unit 400 which can vary own resistance value. The rest is structured same as the operational amplifier of FIG. 7, and the description for the parts is omitted.

In FIG. 11, 400 is a variable resistor unit, and it includes, inside, three resistor elements $R_{11}$, $R_{12}$, and $R_{13}$, each having a different resistance value, and three MOS switches (switches) $M_{11}$, $M_{12}$, and $M_{13}$ corresponding to the resistor elements $R_{11}$ to $R_{13}$. The three MOS switches $M_{11}$, to $M_{13}$ are switched by a resistor selection signal from outside (not shown) to turned on or off the three switches $M_{11}$ to $M_{13}$. This switching operation modifies the combination of the three resistor elements $R_{11}$ to $R_{13}$ to vary the resistance value of the variable resistor unit 400.

As described above, this embodiment has a resistor unit in the phase control circuit structured as a variable resistor unit which can vary the resistance value, and it is possible to flexibly control the resistance value of the variable resistor unit using results of circuit simulation. The resistance value may be controlled, after producing an operational amplifier, to the optimum value which does not cause overshoot while observing the output waveform by, for example, an oscilloscope. It also may be automatically controlled to optimize the transient response according to the capacitance value of the load unit and/or the output waveform of the operational amplifier. In the case that the capacitance value of the load unit inside the operational amplifier varies while driving the operational amplifier, the resistance value also may be controlled to automatically vary according to the capacitance value. Therefore, according to the operational amplifier of this embodiment, it is possible to control the phase margin of the operational amplifier to the optimum value more flexibly than with the operational amplifier of the first embodiment.

As a matter of course, the MOS switches $M_{11}$, $M_{12}$, and $M_{13}$ may be active elements, such as NMOS, PMOS, CMOS, and a bipolar.

Figure 12:
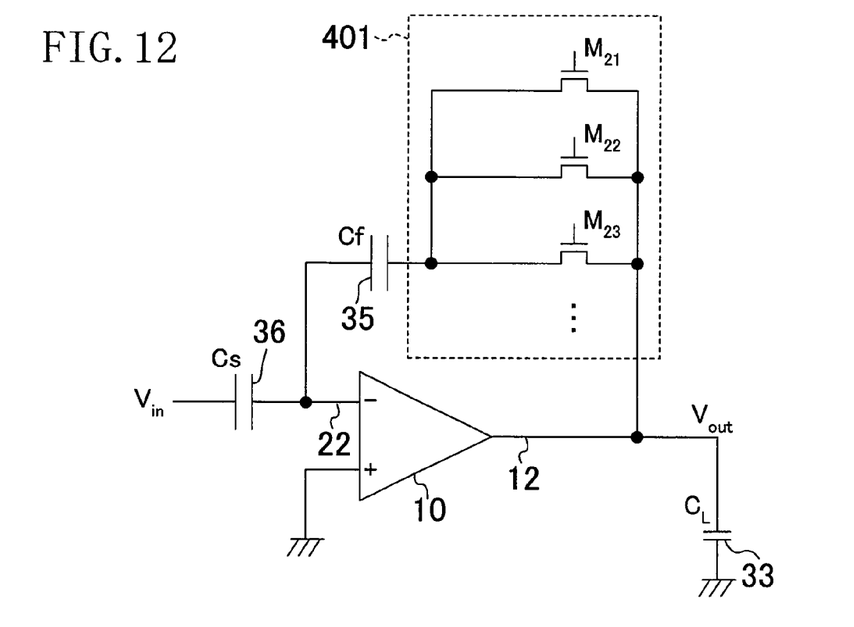
FIG. 12 is an example of a modified operational amplifier of the second embodiment.

An example of the variable resistor unit 401 may include, as shown in FIG. 12, a plurality of MOS switches $M_{21}$, $M_{22}$, and $M_{23}$ inside, each different in size, to use the ON resistances of them may be used as a substitution of the resistance value of the resistor element.

Figure 13:
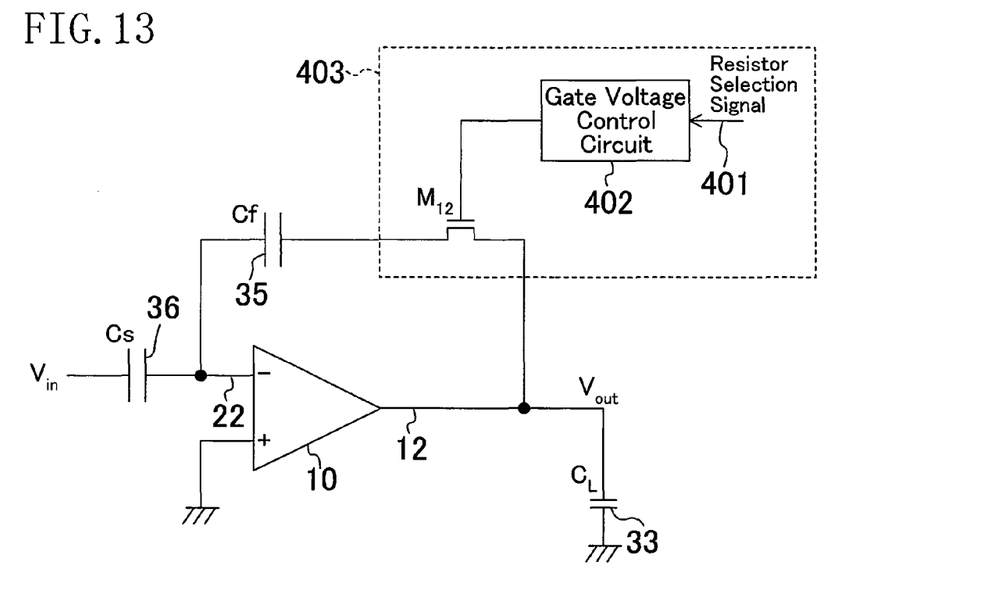
FIG. 13 is another example of a modified operational amplifier of the second embodiment.

An example of the variable resistor unit 403 may include, as shown in FIG. 13, one MOS switch $M_{12}$ and a gate voltage control circuit 402 inside to control the gate voltage provided for the MOS switch $M_{12}$ from the gate voltage control circuit 402 by resistor selection signal 401 from outside and vary the ON resistance of the MOS switch $M_{12}$. In this case, the gate voltage control circuit 402 for varying the gate voltage is formed of a D/A converter which changes the resistor selection signal to an analog voltage value for outputting it or a booster circuit, such as a bootstrap circuit. The output voltage of the gate voltage control circuit 402 is controlled so as to increase the voltage between the gate and the source of the MOS switch $M_{12}$ for decreasing the resistance value of the variable resistor unit 403, and on the contrary, to decrease the voltage applied between the gate and the source for increasing it. The ON resistance of the MOS switch $M_{12}$ also may be varied by controlling the backgate voltage of the MOS switch $M_{12}$.

Third Embodiment

Figure 14:
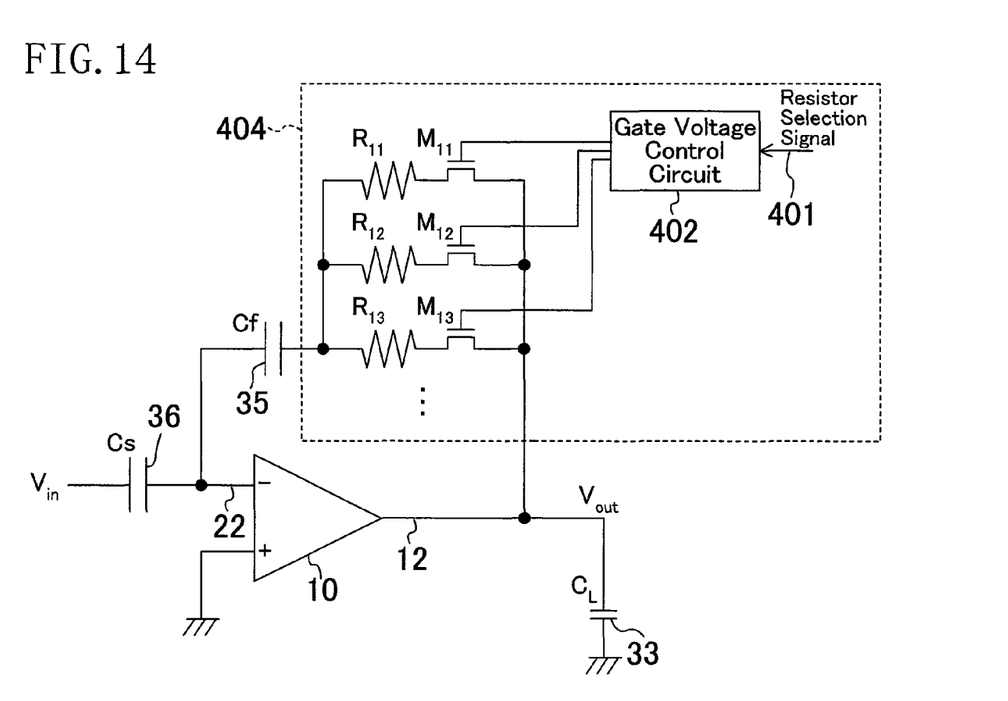
FIG. 14 is a circuit diagram illustrating the overall structure of an operational amplifier according to the third embodiment of the present invention.

FIG. 14 is a circuit diagram illustrating the overall structure of an operational amplifier according to the third embodiment of the present invention.

The difference from the operational amplifier of the second embodiment shown in FIG. 11 is only that a variable resistor unit 404 includes, inside, three resistor elements $R_{11}$, $R_{12}$, and $R_{13}$, each having a different resistance value, three MOS switches (switches) $M_{11}$, $M_{12}$, and $M_{13}$ corresponding to the resistor elements $R_{11}$ to $R_{13}$, and a gate voltage control circuit 402 controlling the ON resistances of the MOS switches $M_{11}$, $M_{12}$, and $M_{13}$. The rest is structured same as the operational amplifier of the embodiment in FIG. 11, and the description for the parts is omitted.

In FIG. 14, the three MOS switches $M_{11}$ to $M_{13}$ are turned on and/or off to modify the combination of the three resistor elements $R_{11}$ to $R_{13}$, each having a different resistance values, and modify the resistance value of the variable resistor unit 404 for the phase margin control.

After that, the gate voltage control circuit 402 modifies the ON resistances of the three MOS switches $M_{11}$ to $M_{13}$ to further fine-adjust the phase margin.

As described above, this embodiment uses both phase control using the combination of the three resistor element $R_{11}$ to $R_{13}$, each having a different resistance value, and phase control modifying the ON resistances of the three MOS switches $M_{11}$ to $M_{13}$, and it enables to control the phase margin of the operational amplifier even more flexibly.

Figure 15:
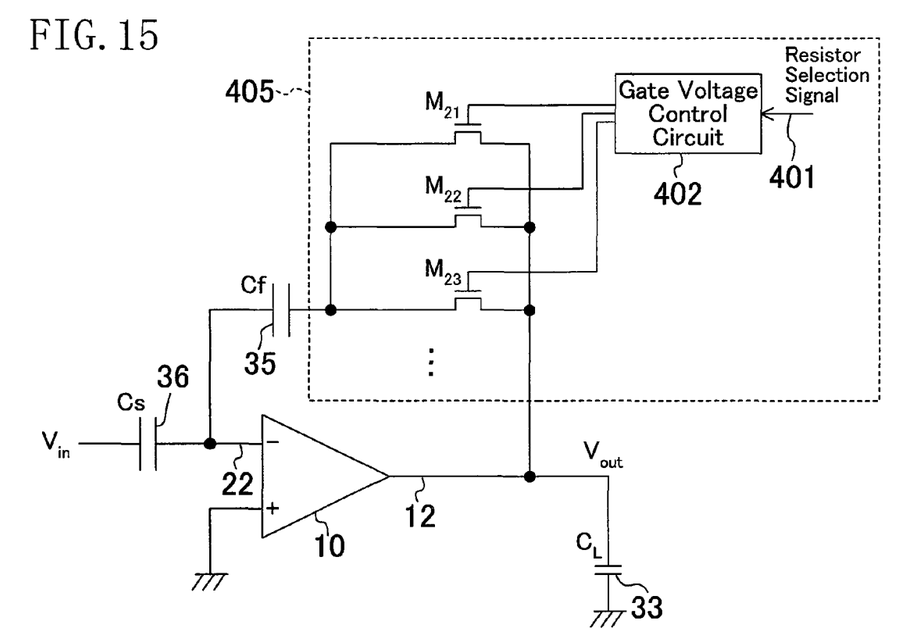
FIG. 15 is an example of a modified operational amplifier of the third embodiment.

As shown in FIG. 15, the phase margin also may be controlled by controlling only the ON resistance of each of the MOS switches $M_{11}$ to $M_{13}$. That is, the phase margin also may be fine-adjusted further by, after modifying the combination of the MOS switches $M_{11}$ to $M_{13}$ to control the resistance value of the variable resistor unit 405, modifying the ON resistance of each of the MOS switches $M_{11}$ to $M_{13}$.

As described above, since the present invention includes a phase control circuit between the input and the output of the operational amplification stage, it is possible to include a phase control circuit even for a single-stage operational amplifier having only one operational amplification stage and, when the capacitance value of the load unit driven by the operational amplifier increases and the phase margin is excessively increased, to decrease the phase margin by increasing the resistance value of the resistor unit in the phase control circuit for controlling it so as to fall within the optimum range. Accordingly, even in the case that the transient response of the operational amplifier is deteriorated, accelerated settling properties are successfully realized.

Although the embodiments describe operational amplifiers including one resistor unit in each phase control circuit, a plurality of resistor units also may be included and each of the resistor units also may be determined individually whether to have the resistance value constant or variable.

Figure 16:
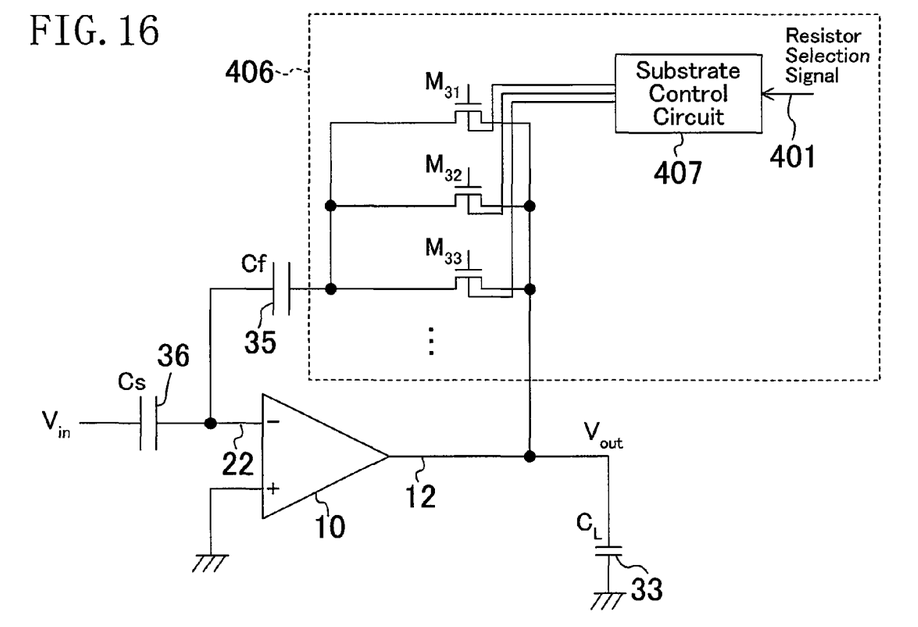
FIG. 16 is a circuit diagram illustrating the overall structure of another operational amplifier of the present invention.

Although the ON resistance of each MOS switch was modified by the gate voltage control circuit in the embodiments, a variable resistor unit 406 may include, as shown in FIG. 16, a substrate control circuit 407 inside to vary each ON resistance of MOS switches $M_{31}$ to $M_{33}$ using the substrate bias effect of each of the MOS switches.

Although the embodiments describe a single-stage operational amplifier having only one operational amplification stage, the present invention is also applicable to a two-stage operational amplifier having two operational amplification stages.

INDUSTRIAL APPLICABILITY

As described above, the present invention enables even a single-stage operational amplifier having only one operational amplification stage to control phase margin of an operational amplifier so as to fall within the optimum range by a phase control circuit and to realize accelerated settling properties. It is thus particularly useful as, for example, an operational amplifier driving a load unit, typically as a switched capacitor amplifier, and an operational amplifier formed of a mixed signal integrated circuit, such as an analog front end, a pipeline analog/digital converter.

The invention claimed is:

1. An operational amplifier comprising:
an operational amplification stage for amplifying a signal;
a sampling capacitor connected to an input side of the operational amplification stage;
a load unit driven by an output signal of the operational amplification stage; and
a phase control circuit having a feedback capacitor connected in negative feedback between an output side of the operational amplification stage and the input side of the operational amplification stage, wherein:
the phase control circuit includes a resistor unit connected in series to the feedback capacitor,
the input side of the operational amplification stage includes a positive phase input terminal and a negative phase input terminal,
the output side of the operational amplification stage includes a positive phase output terminal and a negative phase output terminal,
the phase control circuit includes a first phase control circuit and a second phase control circuit,
the first phase control circuit including a first feedback capacitor connected in negative feedback between the negative phase output terminal and the positive phase input terminal and a first resistor unit connected in series to the first feedback capacitor, and
the second phase control circuit including a second feedback capacitor connected in negative feedback between the positive phase output terminal and the negative phase input terminal and a second resistor unit connected in series to the second feedback capacitor.

2. The operational amplifier according to claim 1, wherein the resistor unit is disposed between the output side of the operational amplification stage and the feedback capacitor.

3. The operational amplifier according to claim 1, wherein the resistor unit is disposed between the input side of the operational amplification stage and the feedback capacitor.

4. The operational amplifier according to claim 2, wherein the load unit is connected between the resistor unit and the feedback capacitor.

5. The operational amplifier according to claim 1, wherein the resistor unit is disposed at least one of: a position between the output side of the operational amplification stage and the feedback capacitor; and a position between the feedback capacitor and the input side of the operational amplification stage.

6. The operational amplifier according to claim 1, wherein the resistor unit includes a transistor, and a resistance value of the resistor unit is an ON resistance of the transistor.

7. The operational amplifier according to claim 1, wherein the resistor unit is a variable resistor unit having a variable resistance value.

8. The operational amplifier according to claim 7, wherein the variable resistor unit includes a plurality of resistor elements having different resistance values, and a switch, and
the resistance value of the variable resistor unit is varied by switching the switch to modify the combination of the plurality of resistor elements.

9. The operational amplifier according to claim 8, wherein the switch is a MOS switch, and
the resistance value of the variable resistor unit is varied by varying an ON resistance of the MOS switch.

10. The operational amplifier according to claim 9, wherein
the ON resistance of the MOS switch is varied according to a gate voltage value of a MOS transistor, and
the resistance value of the variable resistor unit varies according to a variation in the gate voltage value.

11. The operational amplifier according to claim 9, wherein
the ON resistance of the MOS switch varies according to a backgate voltage value of a MOS transistor, and
the resistance value of the variable resistor unit varies according to a variation in the backgate voltage value.

12. The operational amplifier according to claim 7, wherein
the variable resistor unit includes a plurality of switches having different ON resistances, and
the resistance value of the variable resistor unit is varied by switching the plurality of switches to modify the combination of the switches.

13. The operational amplifier according to claim 12, wherein
the switch is a MOS switch, and
the resistance value of the variable resistor unit is varied by varying an ON resistance of the MOS switch.

14. The operational amplifier according to claim 13, wherein
the ON resistance of the MOS switch is varied according to a gate voltage value of a MOS transistor, and
the resistance value of the variable resistor unit varies according to a variation in the gate voltage value.

15. The operational amplifier according to claim 13, wherein
the ON resistance of the MOS switch varies according to a backgate voltage value of a MOS transistor, and
the resistance value of the variable resistor unit varies according to a variation in the backgate voltage value.

16. The operational amplifier according to claim 1, wherein the resistor unit is formed of a bipolar transistor.

* * * * *